United States Patent

Hoogzaad

(10) Patent No.: US 9,948,247 B2
(45) Date of Patent: Apr. 17, 2018

(54) RF AMPLIFIER

(71) Applicant: NXP B.V., Eindhoven (NL)

(72) Inventor: Gian Hoogzaad, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/209,816

(22) Filed: Jul. 14, 2016

(65) Prior Publication Data

US 2017/0019075 A1    Jan. 19, 2017

(30) Foreign Application Priority Data

Jul. 16, 2015  (EP) .................................... 15177144

(51) Int. Cl.
 *H03F 1/52*  (2006.01)
 *H03F 3/195*  (2006.01)
 *H03F 1/22*  (2006.01)
 *H03F 3/45*  (2006.01)

(52) U.S. Cl.
 CPC ............... *H03F 1/52* (2013.01); *H03F 3/195* (2013.01); *H03F 3/45475* (2013.01); *H03F 2200/18* (2013.01); *H03F 2200/258* (2013.01); *H03F 2200/294* (2013.01); *H03F 2200/426* (2013.01); *H03F 2200/441* (2013.01); *H03F 2200/444* (2013.01); *H03F 2200/451* (2013.01); *H03F 2200/462* (2013.01); *H03F 2200/481* (2013.01); *H03F 2200/489* (2013.01); *H03F 2200/492* (2013.01); *H03F 2200/78* (2013.01)

(58) Field of Classification Search
 USPC ....................... 330/298, 207 P, 310–311, 283
 See application file for complete search history.

(56) References Cited

U.S. PATENT DOCUMENTS

| | | | |
|---|---|---|---|
| 6,600,356 B1 | 7/2003 | Weiss | |
| 6,636,118 B1 | 10/2003 | Kusano et al. | |
| 7,586,720 B1 | 9/2009 | Ozard | |
| 7,787,227 B1 | 8/2010 | Terrovits | |
| 7,948,320 B2 * | 5/2011 | Splithof | H03F 1/52 330/285 |

(Continued)

FOREIGN PATENT DOCUMENTS

| | | |
|---|---|---|
| DE | 3306596 A1 | 9/1984 |
| JP | 2010-200056 | 9/2010 |
| WO | WO-91/19348 A1 | 12/1991 |

OTHER PUBLICATIONS

Extended European Search Report for Patent Appln. No. 15177144.1 (Dec. 8, 2015).

(Continued)

*Primary Examiner* — Hieu Nguyen

(57) ABSTRACT

An RF amplifier comprising an input-transistor having an input-transistor-base terminal, an input-transistor-collector terminal and an input-transistor-emitter terminal; a degeneration-component connected between the input-transistor-emitter terminal and a ground terminal; and a protection-transistor having a protection-transistor-base terminal, a protection-transistor-collector terminal and a protection-transistor-emitter terminal. The input-transistor-base terminal is connected to the protection-transistor-emitter terminal, and the protection-transistor-base terminal is connected to the input-transistor-emitter.

12 Claims, 6 Drawing Sheets

(56) References Cited

U.S. PATENT DOCUMENTS

| | | |
|---|---|---|
| 9,608,437 B2 * | 3/2017 | Youssef ............... H02H 9/046 |
| 2006/0197594 A1 | 9/2006 | Scuderi et al. |
| 2006/0255880 A1 | 11/2006 | Suzaki et al. |
| 2007/0223158 A1 | 9/2007 | Ma et al. |
| 2007/0262343 A1 | 11/2007 | Kuramoto |
| 2010/0103572 A1 | 4/2010 | Worley |
| 2011/0286136 A1 | 11/2011 | Tsai |

OTHER PUBLICATIONS

Mergens, Markus P.J. et al; "Speed Optimized Diode-Triggered SCR (DTSCR) for RF ESD Protection of Ultra-Sensitive IC Nodes in Advanced Technologies"; IEEE Transactions on Device and Materials Reliability, vol. 5, No. 3; pp. 532-5421 (Sep. 2005).

\* cited by examiner

RF AMPLIFIER

CROSS-REFERENCE TO RELATED APPLICATIONS

This application claims the priority under 35 U.S.C. § 119 of European patent application no. 15177144.1, filed Jul. 16, 2015 the contents of which are incorporated by reference herein.

The present disclosure relates to RF amplifiers.

According to a first aspect of the present disclosure there is provided an RF amplifier comprising:

- an input-transistor having an input-transistor-base terminal, an input-transistor-collector terminal and an input-transistor-emitter terminal;
- a degeneration-component connected between the input-transistor-emitter terminal and a ground terminal; and
- a protection-transistor having a protection-transistor-base terminal, a protection-transistor-collector terminal and a protection-transistor-emitter terminal;
- wherein the input-transistor-base terminal is connected to the protection-transistor-emitter terminal, and the protection-transistor-base terminal is connected to the input-transistor-emitter.

Such an RF amplifier can advantageously provide good robustness for large RF input power, whilst retaining good RF performance.

In one or more embodiments the emitter area of the protection-transistor is less than 40% of the emitter area of the input-transistor.

In one or more embodiments the degeneration-component comprises a degeneration-inductance.

In one or more embodiments the base-emitter junction of the protection-transistor is connected directly across the base-emitter junction of the input-transistor.

In one or more embodiments the RF amplifier further comprises a cascode-transistor. The cascode-transistor may have a cascode-transistor-base terminal, a cascode-transistor-collector terminal and a cascode-transistor-emitter terminal. The cascode-transistor-emitter terminal may be connected to the input-transistor-collector terminal of the input-transistor. The cascode-transistor-base terminal may be connected to a bias circuit. The cascode-transistor-collector terminal may be connected to an RF output terminal.

In one or more embodiments the RF amplifier may further comprise an ESD protection circuit. The ESD protection circuit may include one or more first-ESD-protection diodes connected in series between an RF output terminal and the ground terminal in a first polarity. The series circuit of the one or more first-ESD-protection diodes may have a cathode terminal that is connected to the RF output terminal, and an anode terminal that is connected to the ground terminal.

In one or more embodiments the ESD protection circuit includes one or more second-ESD-protection diodes connected in series with an ESD clamp circuit, between an RF output terminal and the ground terminal in a second polarity that is opposite to the first polarity. The series circuit of the one or more second-ESD-protection diodes may have an anode terminal that is connected, directly or indirectly, to the RF output terminal, and a cathode terminal that is connected, directly or indirectly, to the ground terminal or to an ESD clamp circuit.

In one or more embodiments the RF amplifier may further comprise a current sensor circuit configured to compare a current level through the input-transistor with one or more threshold levels, and provide an output signal representative of the result of the comparison. The current sensor circuit may comprise a sense-resistor that is configured to conduct a current at a level that corresponds to the current level flowing through the input-transistor.

In one or more embodiments the current sensor circuit comprises a sensing-transistor that has a sensing-transistor-base terminal, a sensing-transistor-collector terminal and a sensing-transistor-emitter terminal. The sensing-transistor-emitter terminal may be connected to the input-transistor-collector terminal. The sensing-transistor-collector terminal may be connected to a terminal of the sense-resistor. The sensing-transistor-base terminal may be connected to a bias circuit.

There may be provided an integrated circuit comprising any RF amplifier disclosed herein.

There may be provided an integrated circuit comprising:
- a first signal channel from a first-signal-input-terminal to a first-signal-output-terminal, wherein the first signal channel comprises a low noise amplifier comprising any RF amplifier disclosed herein; and
- a second signal channel from a second-signal-input-terminal to a second-signal-output-terminal, wherein the second signal channel comprises a low noise amplifier comprising any RF amplifier disclosed herein;
- wherein the integrated circuit is provided as a flip chip.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which:

FIG. 5 shows Transmission Line Pulse (TLP) characterisation of the RF amplifier of FIG. 3a;

Low Noise Amplifiers LNAs and Variable Gain Amplifiers VGAs can be used in base stations. Also Medium Power Amplifiers MPAs and Power Amplifiers PAs can be used in base stations, for example PAs for Small Cell base stations. These amplifiers can be used in the receive and the transmit RF line-up, and can be cascaded. Consequently, in overload conditions, the maximum RF saturated power Psat at the output of these amplifiers can be (temporarily) present at the input as well. The RF amplifier should be able to deal with these high (for example greater than 20 dBm (100 mW)) input powers at RF frequencies ranging from 400 to 4000 MHz.

Figure 1:
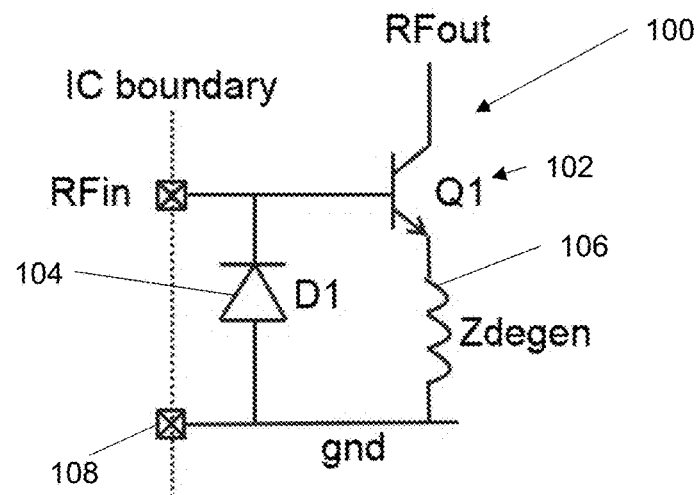
FIG. 1 shows an RF amplifier that has electrostatic discharge (ESD) protection.

FIG. 1 shows an RF amplifier 100, or a similar product, that has electrostatic discharge (ESD) protection. In some examples, the RF amplifier 100 may include additional components that are known in the art, such as matching circuitry, bias circuitry and stability circuits, but are not shown in FIG. 1. The RF amplifier 100 includes an input-transistor 102 that can be degenerated in the emitter either resistively (broadband amplifiers) or inductively (narrow-band amplifiers) for reasons of input matching or improved linearity by series feedback.

The RF amplifier 100 also includes an ESD diode 104 and a degeneration-component, which in this example is a degeneration-inductance 106. The anode of the ESD diode 104 is connected to a ground terminal 108, and the cathode of the ESD diode 104 is connected to the base terminal of the input-transistor 102. The degeneration-inductance 106 is connected between the emitter terminal of the input-transistor 102 and the ground terminal 108.

At input powers Pin greater than 20 dBm (which equals 100 mW) there will be peak voltages in excess of about 3V (assuming a 50Ω system). In principle this will add to the DC bias level of the base-emitter voltage of the input-transistor 102. The base-emitter voltage can be about 0.7-0.8V in on-state, and about 0V in off-state. The positive going peak of this large Pin can be safely absorbed by the (very) robust forward base-emitter diode operation of the input-transistor 102. Consequently the forward base-emitter voltage should not exceed about 1V.

Upon inspection of the circuit in FIG. 1, one might expect that the ESD diode 104 will limit the negative going peak and protect the base-emitter of the input-transistor 102 for reverse voltages. However, this may not be the case because:
the ESD diode 104 may not be fast enough (to follow GHz frequencies that may be required for an RF amplifier); and
the ESD diode 104 is not connected directly across the base-emitter of the input-transistor 102 (because the degeneration-inductance 106 is connected between the emitter terminal of the input-transistor 102 and the ground terminal 108).

In terms of ESD protection, the RF amplifier of FIG. 1 (when properly dimensioned) can be ESD compliant >>2 kV HBM (Human Body Model). A positive pulse/zap can be handled by the input-transistor 102. A negative pulse/zap can be handled by the ESD diode 104.

Figure 2:
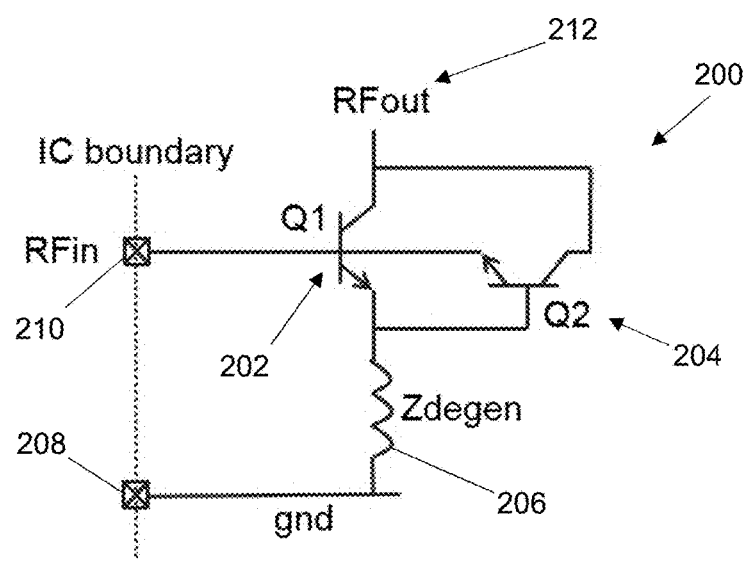
FIG. 2 shows an example embodiment of an RF amplifier.

FIG. 2 shows an example embodiment of an RF amplifier 200. The RF amplifier 200 includes an input-transistor 202 having an input-transistor-base terminal, an input-transistor-collector terminal and an input-transistor-emitter terminal. The RF amplifier 200 also includes a degeneration-inductance 206 connected between the input-transistor-emitter terminal and a ground terminal 208. The degeneration-inductance 206 is an example of a degeneration-component, which in other examples may include a degeneration-resistance.

The input-transistor-base terminal is connected to an RF input terminal 210. The input-transistor-collector terminal is connected to an RF output terminal 212. It will be appreciated that in some examples the RF output terminal 212 is not an external terminal of an integrated circuit that includes the RF amplifier 200. Such an example is described in more detail below with reference to FIG. 7.

The RF amplifier 200 of FIG. 2 includes a protection-transistor 204 that has a protection-transistor-base terminal, a protection-transistor-collector terminal and a protection-transistor-emitter terminal. The input-transistor-base terminal is connected to the protection-transistor-emitter terminal, and the protection-transistor-base terminal is connected to the input-transistor-emitter. In this example the protection-transistor-collector terminal is connected to the RF output terminal 212, although it can be connected to any arbitrary node, or even left as open circuit.

As will be discussed below, connecting the protection-transistor 204 to the input-transistor 202 in this way improves the input robustness of the RF amplifier 200, particularly against large RF input power. Improved robustness can result in improved reliability over the device's lifetime. Also, in some examples disclosed herein, improved robustness can be achieved together with a required ESD compliance.

Surprisingly, it has been found that using a protection-transistor 204 that is of the same type (but not necessarily the same size) as the input-transistor 202 can provide particularly good results in terms of input robustness. That is, the diode (the base-emitter junction of the protection-transistor 204) that is used to provide fast protection is the same as the diode (the base-emitter junction of the input-transistor 202) that should be protected. When connected back-to-back (as in FIG. 2) the rugged forward characteristics of the base-emitter junction overrule the weak reverse characteristics, resulting in a situation where both positive and negative going Pin's can be clamped to safe voltages of about 1V. In this way, the base-emitter junction of the protection-transistor 204 is connected directly across the base-emitter junction of the input-transistor.

For minimal detrimental impact on RF performance parameters, the protection-transistor device 204 can be smaller (in terms of emitter area Ae) than that of the input-transistor 202. For the example of FIG. 2, it has been found that connecting the input-transistor 202 and a relatively small protection-transistor 204 back-to-back, can achieve good input robustness and also satisfy ESD requirements. As will be appreciated from the description that follows, the emitter area of the protection-transistor 204 may be less than 40%, 30%, 25%, or 20% of the emitter area of the input-transistor 202, without having a significant impact on the RF performance of the RF amplifier 200.

One or more of the examples disclosed in this document can be well-suited to SiGe technology, such as NXP's established Qubic technology. Such SiGe technology can be used to provide very small transistors, for example with an emitter area of 0.3 um$^2$. In the Qubic4Xi platform, super-beta HBTs can have a BVebo value (reverse breakdown voltage for the base-emitter junction, which represents reverse robustness) of about 1.5V, with a lower limit of 1V. This is in contrast to values of greater than 7V for some GaAs devices. Therefore, one or more of the RF amplifiers disclosed herein that utilise SiGe devices can particularly benefit from an improvement in input robustness, because the input-transistor in such RF amplifiers can be considered as having a weak reverse robustness (BVebo).

The protection-transistor 204 can provide the functionality of a fast protection diode, and can be implemented as a transistor, and even a transistor with weak reverse robustness. In other examples, a Schottky diode can be used as the protection device, instead of the base-emitter connection of the protection-transistor 204. The Schottky diode can be advantageous because it can store less charge than the protection-transistor 204.

The RF amplifier 200 of FIG. 2 can provide protection for both the on-state and off-state of the input-transistor 202, and also provide protection due to fast clamping of a negative part of large swings at the RF input terminal 210.

The RF amplifier of FIG. 2 can be ESD compliant >>2 kV HBM. A positive pulse/zap can again be handled by the input-transistor 202. A negative pulse/zap can be handled by the protection-transistor 204. Consequently, a separate ESD diode may not be required. This ESD compliance is discussed below with reference to FIG. 5.

FIGS. 3a to 3d illustrate alternative example embodiments of an RF amplifier. Features that have already been described with reference to FIG. 2 will not necessarily be described with reference to FIGS. 3a to 3d.

Figure 3A:
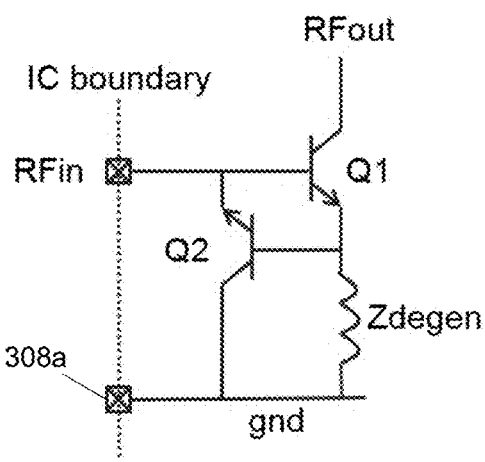
FIGS. 3a to 3d illustrate alternative example embodiments of an RF amplifier.

In FIG. 3a the protection-transistor-collector terminal is connected to the ground terminal 308a.

Figure 3B:
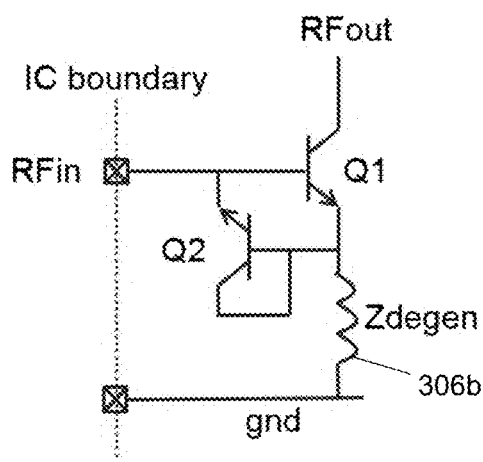

In FIG. 3b the protection-transistor-collector terminal is connected to a node between the input-transistor-emitter terminal and the degeneration-inductance 306b. In this way, the protection-transistor-collector terminal is also connected to the protection-transistor-base terminal.

Figure 3C:
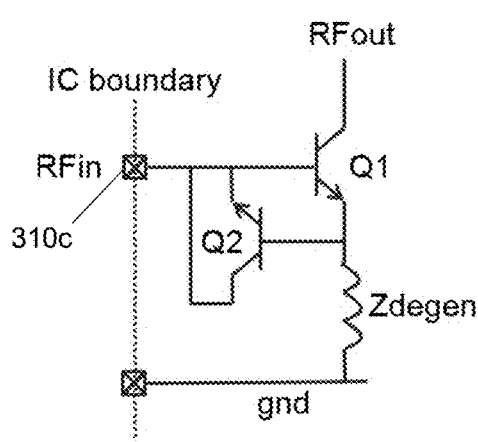

In FIG. 3c the protection-transistor-collector terminal is connected to the RF input terminal 310a, which is also connected to the input-transistor-base terminal and the protection-transistor-emitter terminal.

Figure 3D:
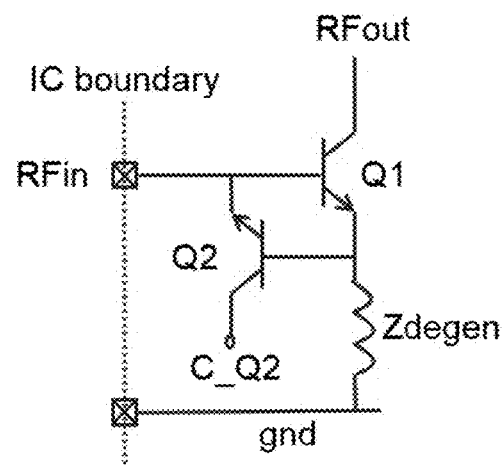

In FIG. 3d the protection-transistor-collector terminal is left open/floating.

Common to the RF amplifiers of each of FIGS. 3a to 3d is the back-to-back connection of the base-emitter junctions of the input-transistor and the protection-transistor. The RF amplifiers of FIGS. 3b and 3c can also provide advantages in terms of latch-up sensitivity. The RF amplifier of FIG. 3c can also beneficially have only small negative impact on noise figure. It will be appreciated from FIGS. 3a to 3d that the collector of the protection-transistor can be connected to any arbitrary node, or even left open as in FIG. 3d.

One or more of the RF amplifiers disclosed herein can be implemented in SiGe technology. In this technology, with a reverse emitter-base bias, hot carriers may cause interface states at the emitter perimeter. The interface states may give rise to a non-ideal contribution to the base current, Ib, which is expected to be proportional to the emitter perimeter, Pe. The collector current, Ic, is proportional to the emitter area, Ae. Therefore, if hot carriers are present, we would expect the gain of the transistor (NPN beta or hFE) to decrease because Ib increases while Ic remains generally constant. NPN transistor lifetime is defined as the time to 10% beta (hFE) degradation due to hot carriers. In some examples, the maximum allowed NPN reverse emitter-base voltage is 1.5V.

It has been found that the RF amplifiers of FIGS. 2 and 3a to 3d provide a solution for reverse emitter-base degradation. This has also been validated by application-like measurements, as discussed with reference to FIG. 4 below.

Figure 4:
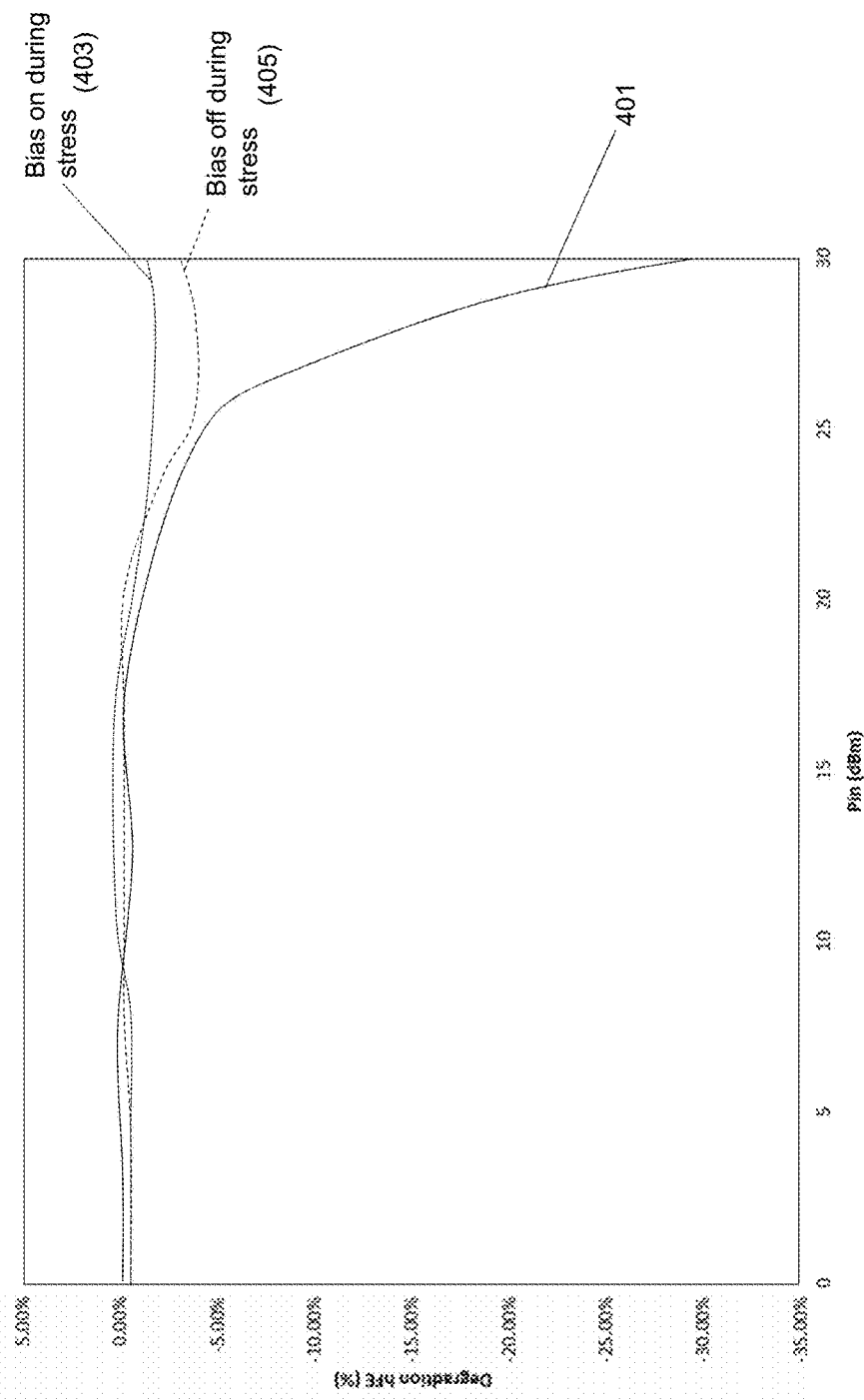
FIG. 4 shows a plot of hFE degradation on the vertical axis, input power on the horizontal axis.

FIG. 4 shows a plot of hFE degradation on the vertical axis, and Pin (input power) in dBm on the horizontal axis. The plots in FIG. 4 show hFE degradation with bias on and off. hFE equals the current gain Ic/Ib of the input-transistor. The degradation of hFE is shown when the input-transistor is stressed for (only) 60 seconds at every natural-numbered Pin (0, 1, 2 ... 29, 30 dBm) and re-measured in between. Operation was at a frequency of 1.95 GHz, and at a temperature of 25° C.

FIG. 4 shows as a first plot measurements for a product according to the circuit of FIG. 1. It can be seen from the first plot of FIG. 4 that at about Pin=25 dBm, reverse emitter-base degradation kicks in heavily and the hFE degradation drops steeply.

FIG. 4 shows as second and third 403, 405 measurements for two products according to the circuit of FIG. 3a. The second plot 403 relates to operation with a bias circuit on during stress. The third plot 405 relates to operation with a bias circuit off during stress. It can be seen from these plots in FIG. 4 that at Pin=24 dBm=250 mW, the protection-transistor starts to help input robustness because the hFE degradation level stops falling so quickly, and then starts to increase. This is in contrast to the operation of the circuit of FIG. 1, as shown by the first plot 401, for which the hFE degradation drops steeply at levels of Pin greater than 25 dBm. Also, operation with a bias circuit on during stress (the second plot 403) results in slightly better hFE performance than operation with a bias circuit that is off during stress (the third plot 405).

The circuit used to provide the results of FIG. 4 included:
an the input-transistor with an emitter area (Ae) of 90 um$^2$; and
a protection-transistor with an emitter area (Ae) of 33 um$^2$.

These components are expected to provide 2 kV HBM ESD compliance with a large margin, for example an expected failure level at about 4.6 kV. The emitter area of the protection-transistor in this example is about 37% of the emitter area of the input-transistor.

It can be seen from FIG. 4 that the dimensions of the components in this example do not have a significant negative impact on RF performance.

Figure 5:
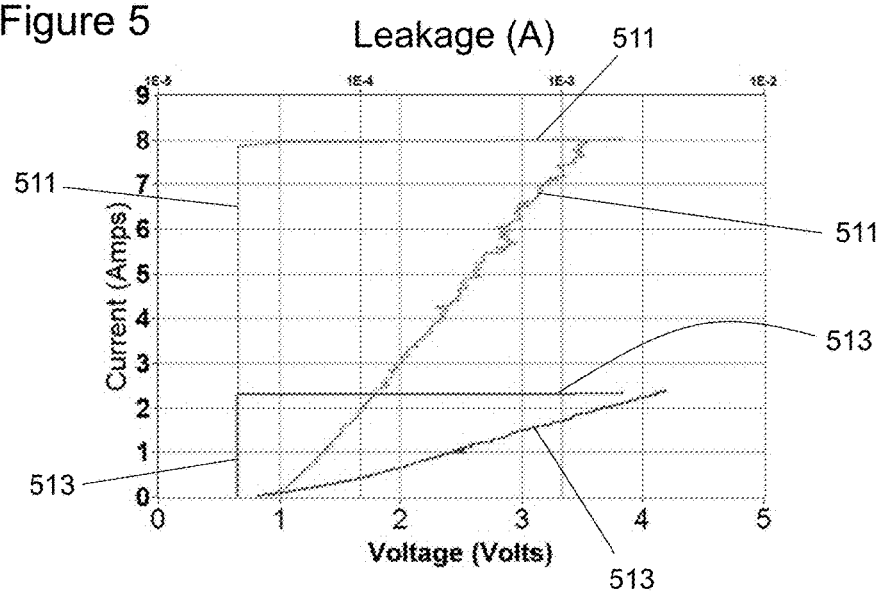

FIG. 5 shows Transmission Line Pulse (TLP) characterisation of the RF amplifier of FIG. 3a, used as a low noise amplifier (LNA). Current is shown on the vertical axis, and voltage is shown on the horizontal axis. As indicated above, the RF amplifier of FIG. 2 can be ESD compliant. This compliance is validated for the RF amplifier of FIG. 3a by the TLP measurements shown in FIG. 5.

A first plot 511 in FIG. 5 shows results for a positive ESD pulse (RFin/GND(exdp) pos). The turn-on voltage (Von) is about 0.8V. In this example, the LNA input-transistor (Q1 in FIG. 3a) is an NPN transistor. FIG. 5 shows that the failing current level for the positive ESD pulse is about 8 A, which corresponds to a robustness of greater than 8 kV HBM.

A second plot 513 in FIG. 5 shows results for a negative ESD pulse (RFin/GND(exdp) neg). The turn-on voltage is about 0.8V. In this example, the base-emitter junction of the protection-transistor (Q2 in FIG. 3a) is of HBT PA-type, which is just one example layout type that can be used. It can be seen from FIG. 5, that the failing current level for the negative ESD pulse is about 2.3 A, which corresponds to a robustness of greater than 4 kV HBM.

A TLP current value of 1 A (on the vertical axis in FIG. 5) is about equivalent to 2 kV HBM of ESD protection. The measured clamping voltage corresponding to 1 A TLP current is 2.5V in FIG. 5, and therefore the ESD power level is 2.5 W. As discussed above with reference to FIG. 4, the protection-transistor starts to assist with input robustness at power levels of about 250 mW. This difference between robustness power level (250 mW) and required ESD power level (2.5 W) is the physical basis why a relatively small protection-transistor device can be used to improve input robustness in the sense that it can be possible to protect an RF amplifier with a protection device only for large RF input powers, but not for ESD compliance. In those cases where this feature is exploited there can be a separate ESD device at the RF input that handles the ESD pulse (like a diode as shown in FIG. 1).

One or more of the circuits disclosed herein can be used in RF applications where cost-effectiveness and robustness are important, including applications in cellular base stations. In such applications, Quality-of-Service can be important as good reliability may be required for 15-20 years continuous (24 hours per day, 7 days per week) operation.

Figure 6:
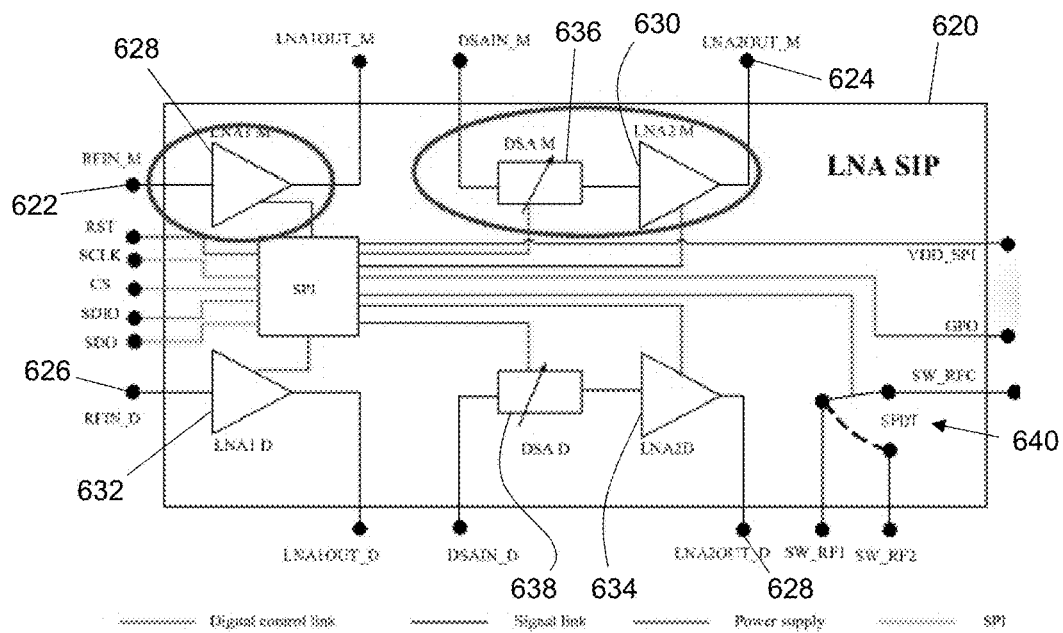
FIG. 6 illustrates an example embodiment of an integrated circuit that can include one or more of the RF amplifiers disclosed herein.

FIG. 6 illustrates an integrated circuit (IC) 620 that can include one or more of the RF amplifiers disclosed herein. At the IC level, RF amplifiers disclosed herein can be used in LNAs that are part of a highly integrated base station product, such as the IC of FIG. 6.

The IC 620 has two signal channels through it: a first/main signal channel from a first-signal-input-terminal (RFIN_M) 622 to a first-signal-output-terminal (LNA2OUT_M) 624; and a second/diversity signal channel from a second-signal-input-terminal (RFIN_D) 626 to a second-signal-output-terminal (LNA2OUT_D) 628. The two channels (main_M and diversity_D) of FIG. 6 have good isolation, which in this example is provided by implementing the IC 620 in flip-chip package technology, with conductive/copper pillars to a laminate. Use of such relatively short length conductive pillars can provide better isolation than relatively long length bond wires that may be used in other technologies. In some examples, deep trench isolation (DTI) can also be used between the two channels (main_M and diversity_D).

The first-signal-input-terminal (RFIN_M) 622 and the second-signal-input-terminal (RFIN_D) 626, are external terminals of the IC 620 and can be connected to respective RF antennae or preceding RF components like diplex filters or RF switches. The first-signal-output-terminal (LNA2OUT_M) 624 and the second-signal-output-terminal (LNA2OUT_D) 628 are also external terminals of the IC 620 and can be connected to respective mixers for downconversion of the processed signal to baseband, for example.

The main blocks of the IC 620 are four LNAs 628, 630, 632, 634, two DSA's (Digital Step Attenuators) 636, 638, one SPDT (Single Pole Double Throw) RF switch 640, and a Serial Peripheral Interface (SPI) 642 for control and communication.

The components of the IC 620 that process the received RF signal in the first signal channel are:
A first-input-LNA (LNA1_M) 628, which has an input terminal connected to the first-signal-input-terminal (RFIN_M) 622, and an output terminal that is connected to a first-input-LNA-output-terminal (LNA1OUT_M), which is an external pin/terminal of the IC 620.
A first-DSA 636 that has an input terminal that is connected to a first-DSA-input-terminal (DSAIN_M), and an output terminal that is connected to an input terminal of a first-output-LNA 630. The first-DSA-input-terminal (DSAIN_M) is an external pin/terminal of the IC 620. In use, an external-filter-circuit can be connected between the first-input-LNA-output-terminal (LNA1OUT_M) and the first-DSA-input-terminal (DSAIN_M).
A first-output-LNA 630, which has an input terminal connected to the output terminal of the first-DSA 636, and an output terminal that is connected to the first-signal-output-terminal (LNA2OUT_M) 624.

The second signal channel has corresponding components that are connected in the same way as described for the first signal channel. The second signal channel includes a second-input-LNA (LNA1_D) 632, a second-DSA 638, and a second-output-LNA 634.

The first-input-LNA 628 and the second-input-LNA 632 (LNA1_M and LNA1_D) are the first amplifiers after the antenna. Consequently, these are particularly vulnerable to overload conditions, for example, due to power amplifier (PA) leakage into the receive path. Therefore, the first-input-LNA 628 and the second-input-LNA 632 can particularly benefit from use of one of the RF amplifiers of FIGS. 2 and 3a to 3d to improve the input robustness of the IC 620.

Figure 7:
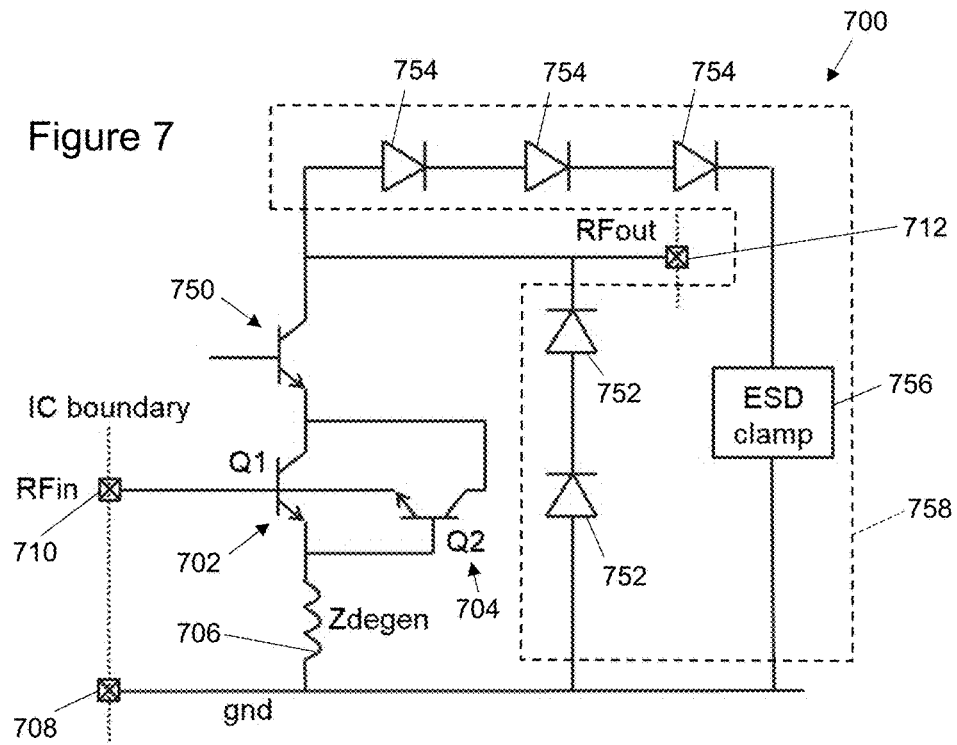
FIG. 7 shows another example embodiment of an RF amplifier that also provides ESD protection.

FIG. 7 shows another example embodiment of an RF amplifier 700, which can also provide RFout ESD protection. Features of FIG. 7 that have already been described with reference to FIG. 2 will not necessarily be described again here.

The RF amplifier 700 of FIG. 7 includes a cascode-transistor 750. The cascode-transistor 750 has a cascode-transistor-base terminal, a cascode-transistor-collector terminal and a cascode-transistor-emitter terminal. The cascode-transistor-emitter terminal is connected to the input-transistor-collector terminal of the input-transistor 702. The cascode-transistor-collector terminal is connected to the RF output terminal 712. In this way, the conduction channel of the cascode-transistor 750, the conduction channel of the input-transistor 702 and the degeneration-inductance 706 are connected in series between the ground terminal 708 and the RF output terminal 712.

The cascode-transistor-base terminal can be connected to a bias circuit (not shown), which can provide a low-ohmic voltage source character at an appropriate voltage—e.g. 2V. The cascode-transistor 750 can increase the open loop voltage gain and RF input-to-output isolation of the RF amplifier 700. Furthermore, the cascode-transistor 750 can improve the robustness for large RF output voltages since typically BVcbo of a cascode transistor is much larger than BVceo of a common emitter configured input transistor such as the input-transistor 702.

In this example, the RF amplifier 700 also includes an optional ESD protection circuit 758. The ESD protection circuit 758 includes one or more (in this example two) first-ESD-protection diodes 752 connected in series between the RF output terminal 712 and the ground terminal 708. In this example, the RF output terminal 712 is an external terminal of an IC on which the RF amplifier 700 is provided. The series circuit of the one or more first-ESD-protection diodes 752 have a cathode terminal that is connected to the RF output terminal 712, and an anode terminal that is connected to the ground terminal 708, such that the first-ESD-protection diodes 752 are connected to between the RF output terminal 712 and the ground terminal 708 in a first polarity. In this example, the first-ESD-protection diodes 752 can conduct a negative ESD pulse at the RF output terminal 712.

The ESD protection circuit 758 also includes one or more (in this example three) second-ESD-protection diodes 754 connected in series with an ESD clamp circuit 756, between the RF output terminal 712 and the ground terminal 708. The ESD clamp circuit 756 (which may also be referred to as a crowbar circuit) can consist of an RC trigger circuit that turns on a large NPN transistor upon detection of an ESD event dV/dt across its terminals. As a consequence, the large NPN transistor will absorb the ESD current thereby protecting the functional circuits of the RF amplifier 700. The series circuit of the one or more second-ESD-protection diodes 754 is connected between the RF output terminal 712 and the ESD clamp circuit 756 in a second polarity that is opposite to the first polarity of the first-ESD-protection diodes 752. The second-ESD-protection diodes 754 have an anode terminal that is connected (directly or indirectly) to the RF output terminal 712, and a cathode terminal that is connected (directly or indirectly) to the ESD clamp circuit 756. In this way, the second-ESD-protection diodes 754 and the ESD clamp circuit 756 can be connected in series between the RF output terminal 712 and the ground terminal 708, and can conduct a positive ESD pulse at the RF output terminal 712. The ESD clamp circuit 756 can be connected to a supply voltage VCC when it is available on the IC.

Advantageously, one or more of the RF amplifiers disclosed in this document can be used with a current monitor/sensor. This can be useful where input robustness is a particular concern. With reference to FIG. 6, a current monitor can be provided as part of the input LNAs (LNA1_M and LNA1_D). It has been found that the presence of a current level that is too high or too low in the LNA1 stage is a good indication of a damaged part. A current monitor can therefore be used to flag a signal when the current at the LNA1s is not correct, which in some examples can be communicated to the system by an SPI. In some examples two signals can be flagged: one for too high an LNA current, and one for too low an LNA current. In base station applications, this information can be used by the mobile operator to replace damaged circuit boards.

Figure 8:
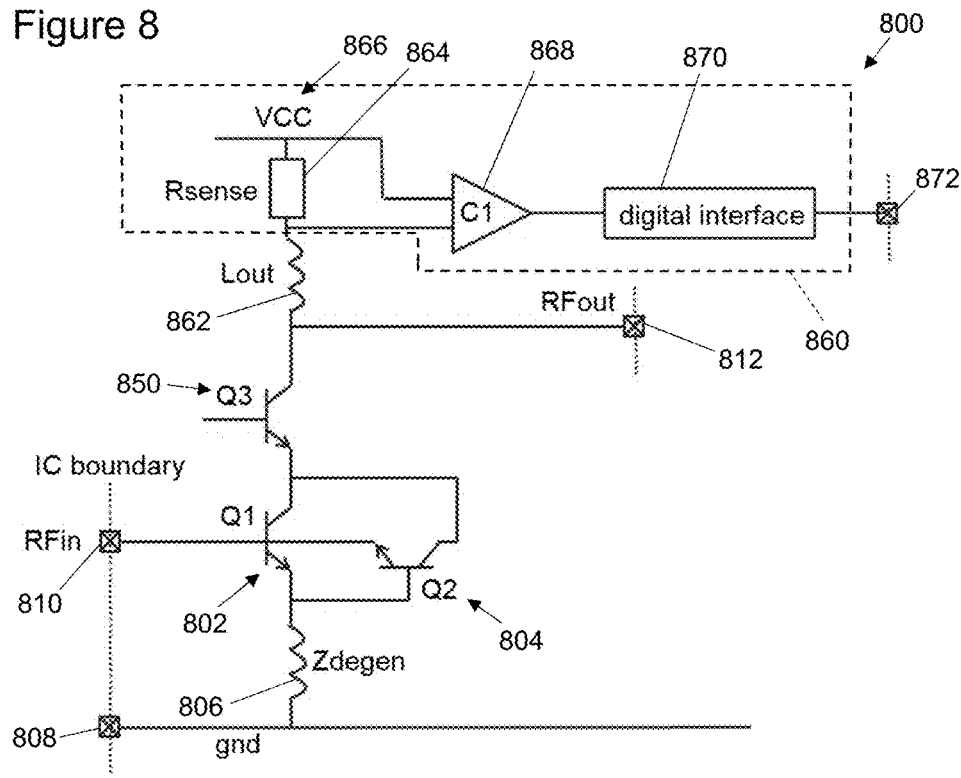
FIG. 8 shows an example embodiment of an RF amplifier with a current sensor circuit.

FIG. 8 shows an example embodiment of an RF amplifier 800 with a current sensor/monitor circuit 860. Features of FIG. 8 that have already been described with reference to FIG. 7 will not necessarily be described again here. The current sensor circuit 860 compares a current level through the input-transistor 802 with one or more threshold levels, and provides an output signal representative of the result of the comparison/comparisons.

The RF amplifier 800 of FIG. 8 includes an output inductor 862 having a first-output-inductor terminal and a second-output-inductor terminal. The first-output-inductor terminal is connected to the RF output terminal 812.

The current sensor circuit 860 includes a sense-resistor 864, which is connected between the second-output-inductor terminal of the output inductor 862 and a VCC voltage supply terminal 866. In this way, the sense-resistor 864 conducts a DC current at a level that closely corresponds to the DC current level flowing through the conduction channel (between the input-transistor-collector terminal and the input-transistor-emitter terminal) of the input-transistor 802.

The current sensor circuit 860 also includes a comparator 868 that has a first input terminal and a second input terminal, which are connected to respective ends of the sense-resistor 864. In this way, the comparator 868 receives a signal that is representative of the current flowing through the input-transistor 802. In this example, the comparator 868 also receives two threshold/reference signals at two threshold-input terminals (not shown). The comparator 868 compares the voltage across the sense-resistor 864 with the two reference voltage signals. One of the reference voltage signals represents a trip level that indicates when the current through the RF amplifier (which may be referred to as LNA current in some applications) is too low. The other reference voltage signal represents a trip level that indicates when the current through the RF amplifier is too high. Indicators of whether or not the trip levels have been exceeded (either greater than an upper-threshold-level or less than a lower-threshold-level) can be made available in registers which can be communicated to the system through a (optionally serial) digital interface. These indicators can be the outputs of the comparator 868.

The comparator 868 has an output terminal that provides an output signal that is indicative of whether or not the voltage across the sense-resistor 864 is too high or too low. In this example, the output terminal of the comparator 868 is connected to a digital interface 870 (an example of which is the SPI component in FIG. 6), to provide an output signal to a current-sense-output terminal 872 that is in an appropriate form for subsequent processing. The current-sense-output terminal 872 may be an external terminal of an IC in which the RF amplifier 800 is provided. With reference to FIG. 6, the pins labelled as RST/SCLK/CS/SDIO/SDO can be external terminals of the IC. The temrinals labelled SDIO and SDO can provide the Indicators of whether or not the trip levels have been exceeded.

In this example, the output coil/inductor 862 is integrated on the same IC as the other components of the RF amplifier 800. This can enable the current through the input-transistor 802 to be sensed on the cold side (where little RF signal is present) of the output inductor 862. All of the components shown in FIG. 8 can be provided on the same integrated circuit (IC).

Figure 9:
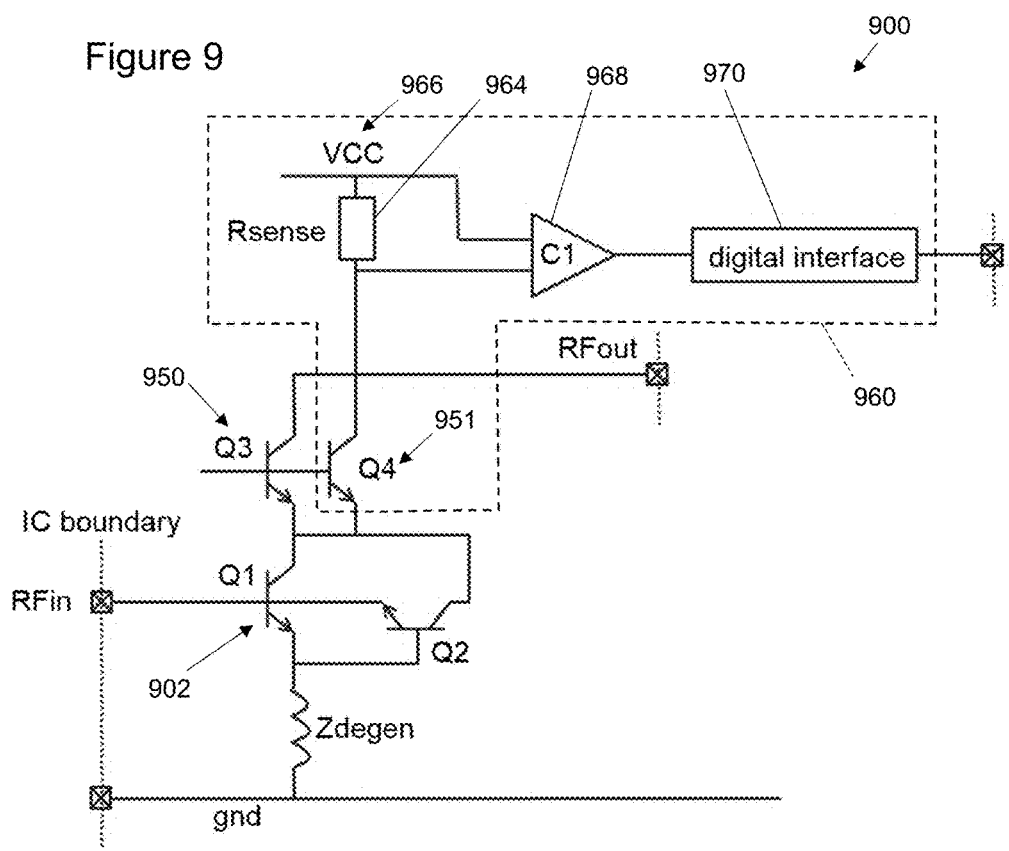
FIG. 9 shows another example embodiment of an RF amplifier with a current sensor circuit.

FIG. 9 shows an example embodiment of an RF amplifier 900 with a current sensor/monitor circuit 960. Features of FIG. 9 that have already been described with reference to FIG. 8 will not necessarily be described again here.

The current sensor 960 includes the following components, which are similar to the corresponding components of FIG. 8: a sense-resistor 964, a comparator 968, and a digital interface 970.

In this example, the current sensor 960 also includes a sensing-transistor 951. The sensing-transistor 951 has a sensing-transistor-base terminal, a sensing-transistor-collector terminal, and a sensing-transistor-emitter terminal. The sensing-transistor-emitter terminal is connected to the input-transistor-collector terminal. The sensing-transistor-base terminal is connected to the cascode-transistor-base terminal, which as discussed above can be connected to a bias circuit. The sensing-transistor-collector terminal is connected to both the sense-resistor 964 and an input terminal of the comparator 968.

In this way, the sensing-transistor 951 can be considered as being in parallel with the cascode-transistor 950. The sensing-transistor 951 can have an emitter area that is smaller than/scaled down relative to the emitter area of the cascode-transistor 950. In some examples, the sensing-transistor 951 can be thermally coupled to the cascode-transistor 950.

The RF amplifier 900 of FIG. 9 can be particularly advantageous when the output coil (not shown in FIG. 9) is not integrated on the same IC as the RF amplifier 900. Instead, the output coil can be connected to the application board as a discrete component, which provides a design freedom for different output coils to be used, with different component values. Such different component values can be useful for different applications, for example for use with different frequency bands.

One or more of the RF amplifiers disclosed herein can be used in base station systems.

One or more the RF amplifiers disclosed herein can provide the following advantages:
  improved robustness of amplifiers for large RF input power; and/or
  improved base current degradation of the input-transistor, which would otherwise result in deteriorated RF performance parameters such as noise figure and linearity.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled or connected, whilst still enabling the required functionality to be achieved.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An RF amplifier comprising:
an input-transistor having an input-transistor-base terminal, an input-transistor-collector terminal and an input-transistor-emitter terminal;
a degeneration-component connected between the input-transistor-emitter terminal and a ground terminal;
a protection-transistor having a protection-transistor-base terminal, a protection-transistor-collector terminal and a protection-transistor-emitter terminal;
wherein the input-transistor-base terminal is connected to the protection-transistor-emitter terminal, and the protection-transistor-base terminal is connected to the input-transistor-emitter;
a current sensor circuit configured to compare a current level through the input-transistor with one or more threshold levels, and provide an output signal representative of the result of the comparison;
wherein the current sensor circuit comprises a sense-resistor that is configured to conduct a current at a level that corresponds to the current level flowing through the input-transistor
wherein the current sensor circuit includes,
a sensing-transistor that has a sensing-transistor-base terminal, a sensing-transistor-collector terminal and a sensing-transistor-emitter terminal, and wherein
the sensing-transistor-emitter terminal is connected to the input-transistor-collector terminal,
the sensing-transistor-collector terminal is connected to a terminal of the sense-resistor, and
the sensing-transistor-base terminal is configured to be connected to a bias circuit.

2. The RF amplifier of claim 1,
wherein an emitter area of the protection-transistor is less than 40% of the emitter area of the input-transistor.

3. The RF amplifier of claim 1,
wherein the degeneration-component comprises a degeneration-inductance.

4. The RF amplifier of claim 1,
wherein a base-emitter junction of the protection-transistor is connected directly across a base-emitter junction of the input-transistor.

5. The RF amplifier of claim 1,
further comprising a cascode-transistor, the cascode-transistor having a cascode-transistor-base terminal, a cascode-transistor-collector terminal and a cascode-transistor-emitter terminal,
wherein the cascode-transistor-emitter terminal is connected to the input-transistor-collector terminal of the input-transistor, and
wherein the cascode-transistor-base terminal is connected to a bias circuit.

6. The RF amplifier of claim 5,
wherein the cascode-transistor-collector terminal is connected to an RF output terminal.

7. The RF amplifier of claim 1,
further comprising an ESD protection circuit.

8. The RF amplifier of claim 7,
wherein the ESD protection circuit includes one or more first-ESD-protection diodes connected in series between an RF output terminal and the ground terminal in a first polarity.

9. The RF amplifier of claim 8,
wherein the series circuit of the one or more first-ESD-protection diodes have a cathode terminal that is connected to the RF output terminal, and an anode terminal that is connected to the ground terminal.

10. The RF amplifier of claim 8,
wherein the ESD protection circuit includes one or more second-ESD-protection diodes connected in series with an ESD clamp circuit, between an RF output terminal and the ground terminal in a second polarity that is opposite to the first polarity.

11. An integrated circuit comprising the RF amplifier of claim 1.

12. An integrated circuit comprising:
a first signal channel from a first-signal-input-terminal to a first-signal-output-terminal, wherein the first signal channel comprises a low noise amplifier comprising the RF amplifier of claim 1; and
a second signal channel from a second-signal-input-terminal to a second-signal-output-terminal, wherein the second signal channel comprises a low noise amplifier comprising the RF amplifier of claim 1;
wherein the integrated circuit is provided as a flip chip.

* * * * *